United States Patent

Kon

(10) Patent No.: US 11,887,821 B2
(45) Date of Patent: Jan. 30, 2024

(54) EDGE RING, PLASMA PROCESSING APPARATUS, AND MANUFACTURING METHOD OF EDGE RING

(71) Applicant: TOKYO ELECTRON LIMITED, Tokyo (JP)

(72) Inventor: Masato Kon, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 169 days.

(21) Appl. No.: 16/999,648

(22) Filed: Aug. 21, 2020

(65) Prior Publication Data

US 2021/0057194 A1 Feb. 25, 2021

(30) Foreign Application Priority Data

Aug. 23, 2019 (JP) .................................. 2019-153223

(51) Int. Cl.
*H01J 37/32* (2006.01)
*H01L 21/683* (2006.01)

(52) U.S. Cl.
CPC .. *H01J 37/32642* (2013.01); *H01J 37/32091* (2013.01); *H01L 21/6833* (2013.01)

(58) Field of Classification Search
CPC .......... H01J 37/32495; H01J 37/32477; H01J 37/32559
See application file for complete search history.

(56) References Cited

U.S. PATENT DOCUMENTS

| 2002/0000547 A1* | 1/2002 | Yamaguchi ....... H01L 21/68785 257/4 |
| 2002/0074552 A1* | 6/2002 | Weeks, Jr. .......... H01L 29/7787 257/E21.127 |
| 2004/0074605 A1* | 4/2004 | Nezu ................. H01J 37/32623 156/345.47 |
| 2008/0236746 A1* | 10/2008 | Oyabu .............. H01J 37/32642 156/345.23 |

(Continued)

FOREIGN PATENT DOCUMENTS

| CN | 110144567 A | * 8/2019 | ............. C23C 16/24 |
| JP | 2006253200 A | * 9/2006 | |

(Continued)

OTHER PUBLICATIONS

Bauccio [(1993) ASM Metals Reference Book (3rd Edition)—2.2.5 Physical Properties of the Elements. p. 143, 145, 147] (Year: 1993).*

(Continued)

*Primary Examiner* — Ram N Kackar
*Assistant Examiner* — Laureen Chan
(74) *Attorney, Agent, or Firm* — XSENSUS LLP

(57) ABSTRACT

An edge ring includes a first member made of a first material and having a contact surface with plasma generated inside the processing container, and a second member made of a second material having Young's modulus lower than that of the first material. The second member is provided on a side opposite to the contact surface of the first member such that a combined structure of the first member and the second member surrounds a periphery of a substrate placed on a stage inside a processing container of a plasma processing apparatus.

14 Claims, 6 Drawing Sheets

(56) References Cited

U.S. PATENT DOCUMENTS

| | | | | |
|---|---|---|---|---|
| 2009/0294064 | A1* | 12/2009 | Nagayama | H01J 37/32623 156/345.39 |
| 2012/0160808 | A1* | 6/2012 | Kikuchi | H01L 21/6831 156/345.52 |
| 2012/0281334 | A1* | 11/2012 | Sasaki | H01J 37/32642 361/234 |
| 2014/0251207 | A1* | 9/2014 | Cuvalci | H01L 21/68785 118/500 |
| 2015/0024155 | A1* | 1/2015 | Sun | C23C 14/08 427/596 |
| 2016/0189994 | A1 | 6/2016 | Sasaki et al. | |
| 2016/0343547 | A1* | 11/2016 | Lim | H01L 21/68757 |
| 2018/0182635 | A1* | 6/2018 | Tsukahara | C23C 16/4585 |
| 2019/0172687 | A1* | 6/2019 | Ikari | H01J 37/32605 |

FOREIGN PATENT DOCUMENTS

| | | | |
|---|---|---|---|
| JP | 2012-204742 | A | 10/2012 |
| JP | 2015065024 | A * | 4/2015 |
| JP | 2016-122740 | A | 7/2016 |
| JP | 2016-225588 | A | 12/2016 |

OTHER PUBLICATIONS

Zhang et al. ((2007). Nanocomposite Thin Films and Coatings—Processing, Properties and Performance. Chapter 4. Synthesis, Characterization and Applications of Nanocrystalline Diamond Films. 4.3.1 MEMS/NEMS Applications of NCD Films. Table 3.1 p. 244 (Year: 2007).*
Kotrechko et al. Nanoscale Research Letters (2015) Mechanical properties of carbyne: experiment and simulations. Abstract. (Year: 2015).*
Castello et al. American Institute of Aeronautics and Astronautics. Structures, Structural Dynamics and Materials Conference. Jan. 2018. Structural Analysis of the Hexakis Icosahedron Lighter than Air Vehicle and the Air. Table 4 Material Properties for Graphene and Carbon Nanotubes. p. 5 (Year: 2018).*
English Machine Translation of Ebata et al. JP2006253200A retrieved from Espacenet May 11, 2022 (Year: 2022).*
English Machine Translation of Du et al. CN110144567A retrieved from Espacenet May 18, 2022 (Year: 2022).*
English Machine Translation of Uehara JP2015065024A retrieved from Espacenet May 19, 2022 (Year: 2022).*
Shackelford et al. (CRC Materials Science and Engineering Handbook (3rd Edition)—Table 409 and Table 413 pp. 1675 and 1682) (Year: 2001).*

* cited by examiner

A-A CROSS SECTION

B-B CROSS SECTION

EDGE RING, PLASMA PROCESSING APPARATUS, AND MANUFACTURING METHOD OF EDGE RING

CROSS-REFERENCE TO RELATED APPLICATIONS

This application is based on and claims priority from Japanese Patent Application No. 2019-153223 filed on Aug. 23, 2019 with the Japan Patent Office, the disclosure of which is incorporated herein in its entirety by reference.

TECHNICAL FIELD

The present disclosure relates to an edge ring, a plasma processing apparatus, and a method for manufacturing the edge ring.

BACKGROUND

An edge ring is provided around a substrate placed on an electrostatic chuck in a processing chamber of a plasma processing apparatus. The edge ring focuses the plasma generated in the processing chamber toward the upper side of the substrate to improve the efficiency of plasma processing on the substrate.

In recent years, for the purpose of extending the life of the edge ring, a material having higher rigidity than silicon (Si), which is represented by silicon carbide (SiC), may be adopted as the material of the edge ring.

A heat transfer gas such as helium (He) is supplied to the lower surface of the edge ring disposed on the outer circumferential side of the electrostatic chuck, and, as a result, the temperature of the edge ring is controlled. For example, Japanese Patent Laid-Open Publication No. 2016-122740 discloses that, in order to suppress an increase in an amount (leakage amount) of the supplied heat transfer gas leaking from the gap between the edge ring and the electrostatic chuck, the focus ring is electrostatically adsorbed during a carry-in/out of a wafer and a waferless dry cleaning (WLDC). See, for example, Japanese Patent Laid-Open Publication No. 2016-225588.

SUMMARY

According to an aspect of the present disclosure, an edge ring includes a first member made of a first material and having a contact surface with plasma generated inside the processing container and a second member made of a second material different from the first material. The second member is provided on a side opposite to the contact surface of the first member such that a combined structure of the first member and the second member surrounds a periphery of a substrate placed on a stage inside a processing container of a plasma processing apparatus. The first material has Young's modulus higher than that of the second material.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
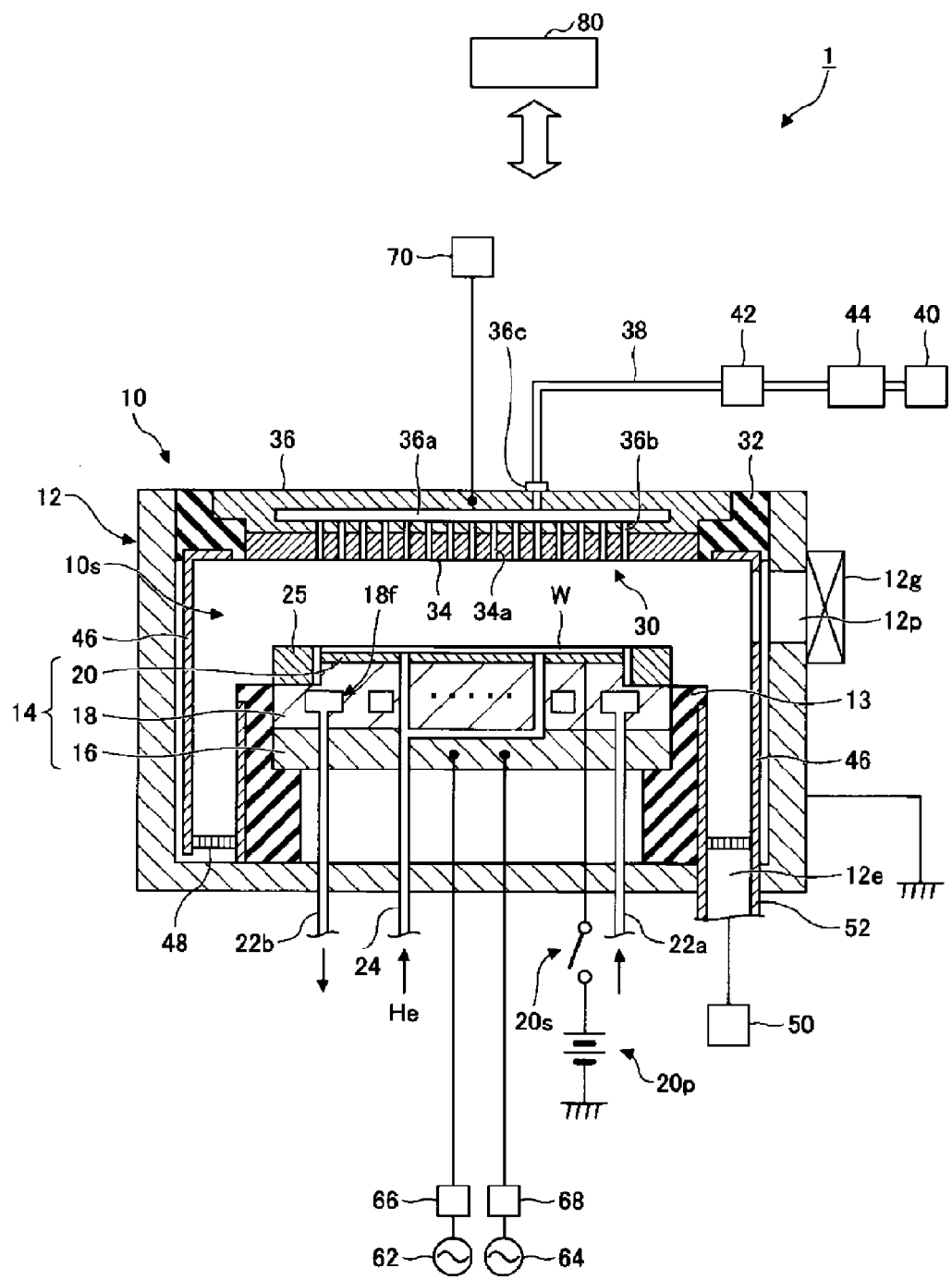
FIG. 1 is a schematic cross-sectional view illustrating an example of a plasma processing apparatus according to an embodiment.

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

Hereinafter, an embodiment of the present disclosure will be described with reference to the drawings. In each drawing, the same components may be denoted by the same reference numerals, and duplicate description may be omitted.

[Plasma Processing Apparatus]

Descriptions will be made on a plasma processing apparatus 1 according to an embodiment with reference to FIG. 1. FIG. 1 is a schematic cross-sectional view illustrating an example of the plasma processing apparatus 1 according to the embodiment.

The plasma processing apparatus 1 includes a processing container 10. The processing container 10 provides an internal space 10s therein. The processing container 10 includes a processing container body 12. The processing container body 12 has a substantially cylindrical shape. The processing container body 12 is made of, for example, aluminum. A film having corrosion resistance is provided on an inner wall surface of the processing container body 12. The film may be ceramics such as aluminum oxide or yttrium oxide.

A passage 12p is formed at a side wall of the processing container body 12. A substrate W is transferred between the internal space 10s and the outside of the processing container 10 through the passage 12p. The passage 12p is opened/closed by a gate valve 12g provided along the side wall of the processing container body 12.

A support 13 is provided on the bottom portion of the processing container body 12. The support 13 is made of an insulating material. The support 13 has a substantially cylindrical shape. The support 13 extends upward from the bottom portion of the processing container body 12 in the internal space 10s. The support 13 includes a stage 14 on the upper portion. The stage 14 is configured to support the substrate W in the internal space 10s.

The stage 14 includes a base 18 and an electrostatic chuck 20. The stage 14 may further include an electrode plate 16. The electrode plate 16 is made of a conductor such as aluminum, and has a substantially disc shape. The base 18 is provided on the electrode plate 16. The base 18 is made of a conductor such as aluminum, and has a substantially disc shape. The base 18 is electrically connected to the electrode plate 16.

The electrostatic chuck 20 is provided on the base 18. The substrate W is placed on the upper surface of the electrostatic chuck 20. The electrostatic chuck 20 includes a body and an electrode. The body of the electrostatic chuck 20 has a substantially disc shape, and is made of a dielectric. The electrode of the electrostatic chuck 20 is a film-like electrode, and is provided in the body of the electrostatic chuck 20. The electrode of the electrostatic chuck 20 is connected to a DC power source 20p through a switch 20s. When a voltage from the DC power source 20p is applied to the electrode of the electrostatic chuck 20, an electrostatic attractive force is generated between the electrostatic chuck 20 and the substrate W. The substrate W is held on the electrostatic chuck 20 by the electrostatic attractive force.

An edge ring 25 is disposed on a circumferential edge of the base 18 to surround a periphery of the substrate W. The edge ring 25 is also referred to as a focus ring. The edge ring 25 improves in-plane uniformity of a plasma processing on the substrate W.

A flow path 18f is provided inside the base 18. A heat exchange medium (e.g., a coolant or heat medium) for temperature adjustment is supplied to the flow path 18f through a pipe 22a from a chiller unit (not illustrated) provided outside the processing container 10. The heat exchange medium supplied to the flow path 18f returns to the chiller unit through a pipe 22b. The temperature of the substrate W placed on the electrostatic chuck 20 is adjusted by the heat exchange between the heat exchange medium and the base 18.

A gas supply line 24 is provided in the plasma processing apparatus 1. The gas supply line 24 supplies a heat transfer gas (e.g., He gas) from a heat transfer gas supply mechanism to a gap between the upper surface of the electrostatic chuck 20 and the rear surface of the substrate W.

The plasma processing apparatus 1 further includes an upper electrode 30. The upper electrode 30 is provided above the stage 14 to face the stage 14. The upper electrode 30 is supported by the upper portion of the processing container body 12 through a member 32. The member 32 is made of an insulating material. The upper electrode 30 and the member 32 close the upper opening of the processing container body 12.

The upper electrode 30 may include a ceiling plate 34 and a support body 36. A lower surface of the ceiling plate 34 is the lower surface on the internal space 10s side, and defines the internal space 10s. The ceiling plate 34 may be made of a low resistance conductor or a semiconductor that generates low Joule heat. The ceiling plate 34 has a plurality of gas discharge holes 34a that penetrates the ceiling plate 34 in a plate thickness direction thereof.

The support body 36 supports the ceiling plate 34 to be freely detached/attached. The support body 36 is made of a conductive material such as aluminum. A gas diffusion chamber 36a is provided inside the support body 36. The support body 36 includes a plurality of gas holes 36b that extends downward from the gas diffusion chamber 36a. The plurality of gas holes 36b communicate with the plurality of gas discharge holes 34a, respectively. A gas introducing port 36c is formed in the support body 36. The gas introducing port 36c is connected to the gas diffusion chamber 36a. A gas supply pipe 38 is connected to the gas introducing port 36c.

The gas supply pipe 38 is connected with a valve group 42, a flow rate controller group 44, and a gas source group 40. The gas source group 40, the valve group 42, and the flow rate controller group 44 constitute a gas supply unit. The gas source group 40 includes a plurality of gas sources. The valve group 42 includes a plurality of opening/closing valves. The flow rate controller group 44 includes a plurality of flow rate controllers. Each of the plurality of flow rate controllers of the flow rate controller group 44 is a mass flow controller or a pressure control type flow rate controller. Each of the plurality of gas sources of the gas source group 40 is connected to the gas supply pipe 38 via a corresponding valve of the valve group 42 and a corresponding flow rate controller of the flow rate controller group 44.

In the plasma processing apparatus 1, a shield 46 is provided to be freely detached/attached along the inner wall surface of the processing container body 12 and the outer circumference of the support 13. The shield 46 prevents reaction byproducts from being adhered to the processing container body 12. The shield 46 is formed by, for example, forming a film having corrosion resistance on the surface of a base material made of aluminum. The film having corrosion resistance may be made of ceramics such as yttrium oxide.

A baffle plate 48 is provided between the support 13 and the side wall of the processing container body 12. The baffle plate 48 is formed by, for example, forming a film (e.g., a film of yttrium oxide) having corrosion resistance on the surface of a base material made of aluminum. A plurality of through-holes is formed in the baffle plate 48. An exhaust port 12e is provided below the baffle plate 48, and also at the bottom portion of the processing container body 12. An exhaust device 50 is connected to the exhaust port 12e through an exhaust pipe 52. The exhaust device 50 includes a vacuum pump such as a pressure adjusting valve and a turbo molecular pump.

The plasma processing apparatus 1 includes a first radio-frequency power source 62 and a second radio-frequency power source 64. The first radio-frequency power source 62 is a power source that generates a first radio-frequency power (hereinafter, also referred to as an "HF electric power or HF power"). The first radio-frequency power has a frequency suitable for plasma generation. The frequency of the first radio-frequency power is, for example, a frequency within a range of 27 MHz to 100 MHz. The first radio-frequency power source 62 is connected to the base 18 via a matcher 66 and the electrode plate 16. The matcher 66 includes a circuit configured to match the output impedance of the first radio-frequency power source 62 and the impedance of the load side (the base 18 side). The first high frequency power source 62 may be connected to the upper electrode 30 via a matcher 66. The first radio-frequency power source 62 constitutes an example of a plasma generating unit.

The second radio-frequency power source 64 is a power source that generates a second radio-frequency power (hereinafter, also referred to as an "LF electric power or LF power"). The second radio-frequency power has a frequency lower than the frequency of the first radio-frequency power. When the second radio-frequency power is used together with the first radio-frequency power, the second radio-frequency power is used as a radio-frequency power for a bias voltage for drawing ions into the substrate W. The frequency of the second radio-frequency power is, for example, a frequency within a range of 400 kHz to 13.56 MHz. The second radio-frequency power source 64 is connected to the base 18 via a matcher 68 and the electrode plate 16. The matcher 68 includes a circuit configured to match the output impedance of the second radio-frequency power source 64 and the impedance of the load side (the base 18 side).

It is possible to generate plasma using the second radio-frequency power without using the first radio-frequency power, that is, using a single radio-frequency power. In this case, the frequency of the second radio-frequency power may be a frequency larger than 13.56 MHz, for example, 40 MHz. Further, in this case, the plasma processing apparatus 1 may not include the first radio-frequency power source 62 and the matcher 66. The second radio-frequency power source 64 constitutes an example of a plasma generating unit.

In the plasma processing apparatus 1, a gas is supplied to the internal space 10s from the gas supply unit to generate plasma. Further, a radio-frequency electric field is generated between the upper electrode 30 and the base 18 by supplying the first radio-frequency power and/or the second radio-frequency power. The generated radio-frequency electric field generates plasma.

The plasma processing apparatus 1 includes a power source 70. The power source 70 is connected to the upper electrode 30. The power source 70 applies a voltage to the upper electrode 30 to draw positive ions present in the internal space 10s into the ceiling plate 34.

The plasma processing apparatus 1 may further include a controller 80. The controller 80 may be a computer including, for example, a processor, a storage unit such as a memory, an input device, a display device, and a signal input/output interface. The controller 80 controls each part of the plasma processing apparatus 1. In the controller 80, an operator may execute an input operation of a command using the input device to manage the plasma processing apparatus 1. Further, in the controller 80, the operation status of the plasma processing apparatus 1 may be visualized and displayed by the display device. Further, a control program and a recipe data are stored in the storage unit. The control program is executed by the processor, in order to execute various processings in the plasma processing apparatus 1. The processor executes the control program, and controls each component of the plasma processing apparatus 1 according to the recipe data.

[Edge Ring]

Figure 2A:
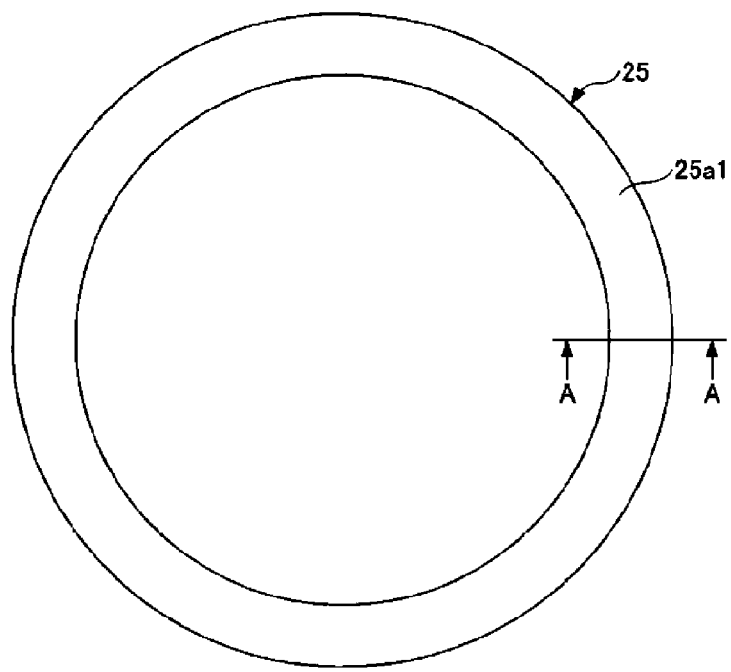
FIGS. 2A and 2B are views illustrating an example of an edge ring according to the embodiment.
Figure 2B:
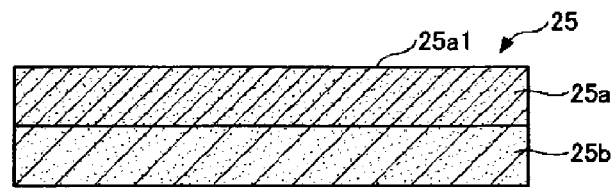

Next, descriptions will be made on an edge ring 25 according to an embodiment with reference to FIGS. 2A and 2B. FIGS. 2A and 2B are views illustrating an example of the edge ring 25 according to the embodiment. FIG. 2A is a top view of the edge ring 25 according to the embodiment. FIG. 2B is a view illustrating a cross section taken along a line A-A in FIG. 2A.

As illustrated in FIG. 2A, the edge ring 25 is formed in a ring shape so as to surround the periphery of the substrate W. An upper surface 25a1 of the edge ring 25 is a surface that is in contact with plasma generated inside the processing container 10, when the edge ring 25 is disposed on the electrostatic chuck 20.

As illustrated in FIG. 2B, the edge ring 25 has a configuration in which an upper member 25a and a lower member 25b are joined to each other. The upper member 25a is made of silicon carbide (SiC). The lower member 25b is made of silicon (Si). The lower member 25b is provided on a side opposite to the upper surface 25a1 of the upper member 25a, that is, a side that is not in contact with the plasma on the edge ring 25.

Since the upper surface 25a1 of the upper member 25a is the surface that is in contact with plasma, the upper surface 25a1 is exposed to plasma and is consumed. The edge ring 25 that is consumed by a predetermined amount or more affects the processing of the substrate W, such as etching characteristics, and thus, is necessary to be replaced. Therefore, it is desirable to select a material that forms the edge ring 25 so as to suppress the consumption of the edge ring 25 and delay the replacement time of the edge ring 25.

Therefore, the upper member 25a is made of silicon carbide harder than silicon, as a member that suppresses the consumption when exposed to plasma. The hardness of the material may be indicated by, for example, Young's modulus.

For example, the material of the upper member 25a (hereinafter, also referred to as a "first material") exposed to plasma has Young's modulus higher than that of the lower member 25b. With regard to the above, the lower member 25b is provided on the side that is not in contact with plasma, and is not exposed to plasma, and thus, the material of the lower member 25b (hereinafter, also referred to as a "second material") may be a material having Young's modulus lower than that of the upper member 25a.

The Young's modulus of silicon is $1.30 \times 10^{11}$ Pa, and the Young's modulus of silicon carbide is $4.30 \times 10^{11}$ Pa. The Young's modulus of silicon carbide is higher than the Young's modulus of silicon. From the above, it may be said that silicon carbide is harder than silicon.

Therefore, the edge ring 25 according to the embodiment may suppress the consumption by making the upper member 25a that is in contact with plasma with silicon carbide as compared with a case where the upper member 25a is made of silicon. As a result, the life of the edge ring 25 may extend, and the replacement timing of the edge ring 25 may be delayed.

On the contrary, the lower member 25b is made of a material softer than the upper member 25a. Because the reason is that, since silicon carbide is harder than silicon, if the lower member 25b is made of silicon carbide, the adsorption of the edge ring 25 deteriorates as compared with a case where the lower member 25b is made of silicon, when the edge ring 25 is adsorbed to the electrostatic chuck 20. As a result, the heat transfer gas leaks from the gap between the edge ring 25 and the electrostatic chuck 20. With regard to the above, it is possible to eliminate the leakage of the heat transfer gas from the gap between the edge ring 25 and the electrostatic chuck 20 by making the lower member 25b with silicon.

From the above, the edge ring 25 according to the embodiment has a configuration in which the upper member 25a and the lower member 25b are joined to each other, and the material having Young's modulus higher than that of the second material forming the lower member 25b is used as the first material forming the upper member 25a. As a result, it is possible to reduce the leakage of the heat transfer gas from the gap between the edge ring 25 and the electrostatic chuck 20 while suppressing the consumption of the edge ring 25.

The upper member 25a is an example of a first member made of the first material and having a contact surface with plasma generated inside the processing container 10. Further, the lower member 25b is an example of a second member made of the second material having Young's modulus lower than that of the first material and provided on a side opposite to the contact surface of the first member.

Further, silicon carbide is an example of the first material, and silicon is an example of the second material. When the second material is silicon, the Young's modulus of silicon is $1.30 \times 10^{11}$ Pa, and thus, the first material may be a material having Young's modulus higher than $1.30 \times 10^{11}$ Pa. The first material may be SiC having Young's modulus higher than that of silicon. However, the first material may be silicon oxide ($SiO_2$) or alumina ($Al_2O_3$) having Young's modulus higher than that of silicon depending on the etching target.

[Joining Method]

A joining method of the upper member 25a and the lower member 25b includes, for example, a melting joining, that is a method in which the surface of the upper member 25a and the lower member 25b are melted by heating and joined to each other.

For example, when the upper member 25a is made of silicon carbide and the lower member 25b is made of silicon, different materials such as silicon carbide and silicon are joined together, and thus, stress is applied to the joining surface when the edge ring 25 is used. Specifically, since the coefficient of linear thermal expansion of silicon carbide is different from that of silicon, when the edge ring 25 is used, the upper member 25a and the lower member 25b repeat thermal expansion and contraction due to heat input of plasma, and friction occurs on the joining surface between the upper member 25a and the lower member 25b. As a result, damage such as cracks or breaks (hereinafter, also referred to as "breakage") may occur at the joining surface between the upper member 25a and the lower member 25b.

[Intermediate Member (Modification)]

Figure 3A:
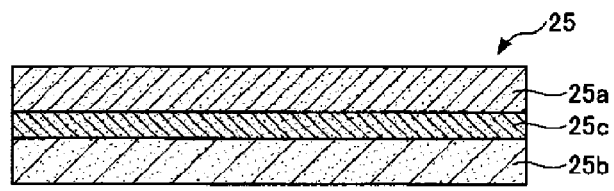
FIGS. 3A to 3E are views illustrating a cross section of an edge ring according to Modifications 1 to 5 of the embodiment.

Therefore, in order to avoid the breakage at the joining surface between the upper member 25a and the lower member 25b, an intermediate member may be provided between the upper member 25a and the lower member 25b. FIGS. 3A to 3E are views illustrating a cross section of the edge rings 25 according to Modifications 1 to 5 of the embodiment. The edge ring 25 according to Modification 1 of the embodiment illustrated in FIG. 3A is provided with an intermediate member 25c between the upper member 25a and the lower member 25b.

The Young's modulus of the material forming the intermediate member 25c may be equal to or smaller than that of the first material forming the upper member 25a, and equal to or larger than that of the second material forming the lower member 25b. As a result, the frictional force applied to the joining surface between the upper member 25a and the lower member 25b due to thermal expansion and contraction may be relieved by the intermediate member 25c. As a result, it is possible to avoid the breakage of the joining surface of the edge ring 25.

For example, when the upper member 25a is made of silicon carbide, and the lower member 25b is made of silicon, the intermediate member 25c may be made of a material in which silicon carbide and silicon are mixed at a predetermined ratio. Further, the intermediate member 25c may be a composition gradient layer in which the mixing ratio of silicon carbide forming the upper member 25a and silicon forming the lower member 25b is changed in the thickness direction. For example, when the upper member 25a is made of silicon carbide, and the lower member 25b is made of silicon, the intermediate member 25c may be a composition gradient layer in which the mixing ratio of silicon carbide to silicon in the intermediate member 25c is set to be higher as closer to the joining surface with the upper member 25a. In this case, the mixing ratio of silicon to silicon carbide in the intermediate member 25c is set to be higher as closer to the joining surface with the lower member 25b. As a result, the frictional force applied to the joining surface between the upper member 25a and the lower member 25b due to thermal expansion and contraction may be relieved by the intermediate member 25c, and it is possible to effectively avoid the breakage of the joining surface of the edge ring 25.

The intermediate member 25c may be formed as a film whose composition changes discretely, and may be formed as a film whose composition changes continuously. An example of the intermediate member 25c formed by a film whose composition changes discretely may include a case where the intermediate member 25c is formed by joining a plurality of plate-like members. The plurality of plate-like members are formed by materials having different compositions, and the plate-like member closer to the joining surface with the upper member 25a has a higher mixing ratio of the first material (silicon carbide) of the upper member 25a to the second material (silicon) of the lower member 25b. Then, the mixing ratio of the first material to the second material is set to be lower as closer to the joining surface with the lower member 25b. As a result, the frictional force applied to the joining surface between the upper member 25a and the lower member 25b due to thermal expansion and contraction may be more effectively relieved by the intermediate member 25c.

The intermediate member 25c formed by a film whose composition changes continuously and the edge ring 25 may be manufactured using, for example, a 3D printer. In this case, the intermediate member 25c has a mixing ratio of the first material (silicon carbide) of the upper member 25a to the second material (silicon) of the lower member 25b that is set to be higher as closer to the joining surface with the upper member 25a. Then, the mixing ratio of the first material to the second material is set to be lower as closer to the joining surface with the lower member 25b.

However, the manufacturing method of the intermediate member 25c and the edge ring 25 is not limited to the method using a 3D printer. For example, the intermediate member 25c and the edge ring 25 may be manufactured using a sputter device. In this case, a target of the first material and a target of the second material are prepared, and the radio-frequency power supplied to each of the targets is changed, and thus, a film may be formed by controlling the mixing ratio of the first material and the second material. For example, for a certain period of time, the radio-frequency power applied to the silicon carbide target is set to be higher than the radio-frequency power applied to the silicon target to increase the blending ratio of silicon carbide to silicon. In a subsequent period of time, the radio-frequency power applied to the silicon carbide target is set to be equal to the radio-frequency power applied to the silicon target to set the blending ratio of silicon carbide and silicon to 5:5. In the next subsequent period time, the radio-frequency power applied to the silicon target is set to be higher than the radio-frequency power applied to the silicon carbide target to increase the blending ratio of silicon to silicon carbide. As described above, the composition of the intermediate member 25c may be controlled by controlling the radio-frequency powers applied to the target of the first material and the target of the second material.

Further, for example, the intermediate member 25c may be manufactured using a chemical vapor deposition (CVD) device. In this case, the intermediate member 25c may be manufactured as a composition gradient layer by changing the gas flow rate ratio of a gas generating a film of the first material and a gas generating a film of the second material.

The composition of the intermediate member 25c may change continuously. However, the composition may change discretely. The intermediate member 25c may not be limited to the composition gradient layer whose composition changes continuously or discretely, but may be made of a material having a constant composition. For example, the intermediate member 25c may be made of either one material of silicon carbide or silicon. The intermediate member 25c may be made of another material other than silicon carbide and silicon, having Young's modulus lower than that of silicon carbide, and also higher than that of silicon.

By joining the upper member 25a and the lower member 25b of the edge ring 25 via the intermediate member 25c, it is possible to have a configuration in which breakage hardly occurs by the edge ring 25, and to increase adhesion between the upper member 25a and the lower member 25b.

[Other Modification]

Figure 3B:
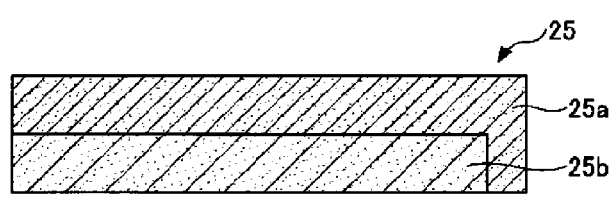
Figure 3C:
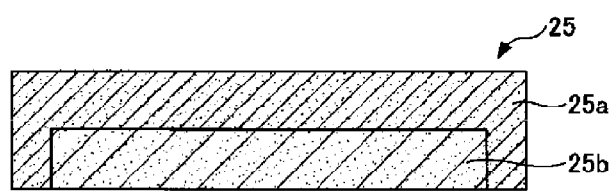

Next, descriptions will be made on the edge rings 25 according to Modifications 2 to 5 according to the embodiment illustrated in FIGS. 3B to 3E. The edge rings 25 according to Modifications 2 and 3 of the embodiment illustrated in FIGS. 3B and 3C are not provided with the intermediate member 25c between the upper member 25a and the lower member 25b. The edge rings 25 according to Modifications 4 and 5 of the embodiment illustrated in FIGS. 3D and 3E are provided with the intermediate member 25c between the upper member 25a and the lower member 25b.

In the edge ring 25 according to Modification 2 illustrated in FIG. 3B, the upper member 25a and the lower member 25b are directly joined to each other, and the side surface of the outer circumferential side (the side opposite to the substrate) of the lower member 25b is covered by the upper member 25a, and thus, the side surface is not exposed.

In the edge ring 25 according to Modification 3 illustrated in FIG. 3C, the upper member 25a and the lower member 25b are directly joined to each other, and both side surfaces of the outer circumferential side and the inner circumferential side of the lower member 25b are covered by the upper member 25a, and thus, both side surfaces are not exposed.

Figure 3D:
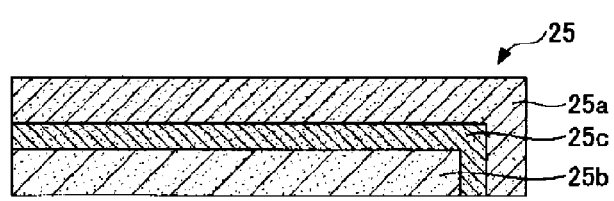
Figure 3E:
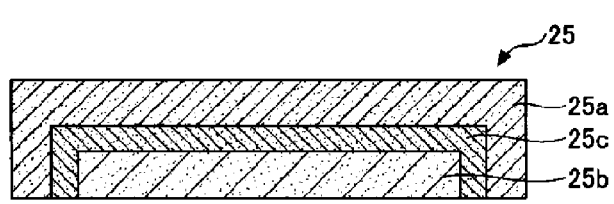

In the edge ring 25 according to Modification 4 illustrated in FIG. 3D, the upper member 25a and the lower member 25b are joined via the intermediate member 25c, and the side surfaces of the outer circumferential side of the intermediate member 25c and the lower member 25b are covered by the upper member 25a, and thus, the side surfaces are not exposed.

In the edge ring 25 according to Modification 5 illustrated in FIG. 3E, the upper member 25a and the lower member 25b are joined via the intermediate member 25c, and both side surfaces of the outer circumferential side and the inner circumferential side of the intermediate member 25c and the lower member 25b are covered by the upper member 25a, and thus, both side surfaces are not exposed.

In the edge rings 25 illustrated in Modifications 2 to 5, the outer side surface or the both side surfaces of the lower member 25b and the intermediate member 25c are not exposed. As a result, the adhering surfaces (joining portions) of the respective members on the outer side surface or the both side surfaces are covered by the upper member 25a, and are not exposed to the plasma wrapping around the side surface of the edge ring 25. As a result, it is possible to suppress the consumption of the adhesive layer between each of the members. The side surface of the inner circumferential side of the lower member 25b or the side surfaces of the inner circumferential side of the lower member 25b and the intermediate member 25c may be covered by the upper member 25a, and may not be exposed.

In particular, when the intermediate member 25c in the edge rings 25 according to the embodiment and Modifications 1 to 5 is the composition gradient layer, the intermediate member 25c and the edge ring 25 may be manufactured using one of a 3D printer technology, an additive manufacturing technology, a sputter device, and a CVD device. Specifically, when the 3D printer technology or the additive manufacturing technology is used, it is possible to use a layer laminate molding technology using materials of silicon and silicon carbide. For example, a molding technology in which powder of the materials of silicon and silicon carbide is irradiated with a laser or an electron beam and is sintered to be molded may be used. Further, a molding technology in which the materials are melted and deposited by a laser or an electron beam to be molded while supplying powder or wires of the materials of silicon and silicon carbide may be used. The above molding technologies are illustrative, and the present disclosure is not limited thereto.

Figure 4A:
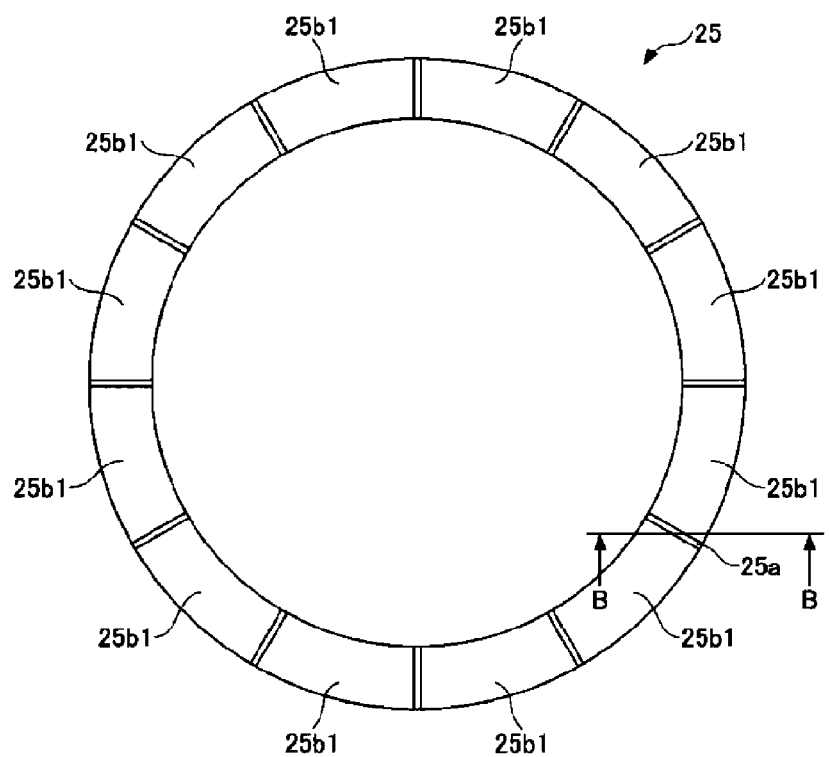
FIGS. 4A and 4B are views illustrating an example of an edge ring according to Modification 6 of the embodiment.
Figure 4B:
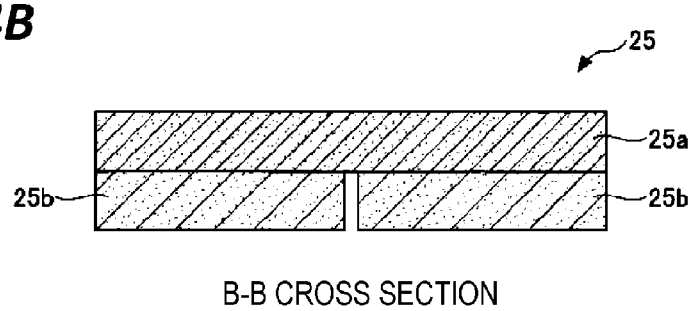

Next, descriptions will be made on the edge ring 25 according to Modification 6 according to the embodiment illustrated in FIGS. 4A and 4B. FIG. 4A is a bottom view of the edge ring 25 according to Modification 6. FIG. 4B is a view illustrating a cross section taken along a line B-B in FIG. 4B.

The edge ring 25 according to Modification 6 is not provided with the intermediate member 25c between the upper member 25a and the lower member 25b. In the edge ring 25 according to Modification 6, the upper member 25a is integrally formed. The lower member 25b is divided into a plurality of parts 25b1 in the circumferential direction. The number of parts 25b1 may be two or more. Each of the parts 25b1 has the same shape, and is evenly disposed in the circumferential direction.

According to the above, the lower member 25b is divided into the plurality of parts 25b1, and a groove is formed between each of the parts 25b1. As a result, the deformation due to the difference in the thermal expansion coefficient between the upper member 25a and the lower member 25b is suppressed from being locally concentrated on the lower member 25b at the time of joining or during use, and thus, the possibility of breakage may be further suppressed.

However, when the lower member 25b is divided into the plurality of parts 25b1, it is important that the division does not affect the back surface adsorption of the edge ring 25 and the back surface cooling due to leakage of the heat transfer gas, or to form, for example, dividing grooves so as to suppress such effects to the minimum.

In the edge ring 25 according to Modification 6, the intermediate member 25c may be provided between the upper member 25a and the lower member 25b. Further, the outer circumferential side or the side surfaces on the both sides of the lower member 25b may be covered by the upper member 25a.

[Manufacturing Method of Edge Ring]

Figure 5:
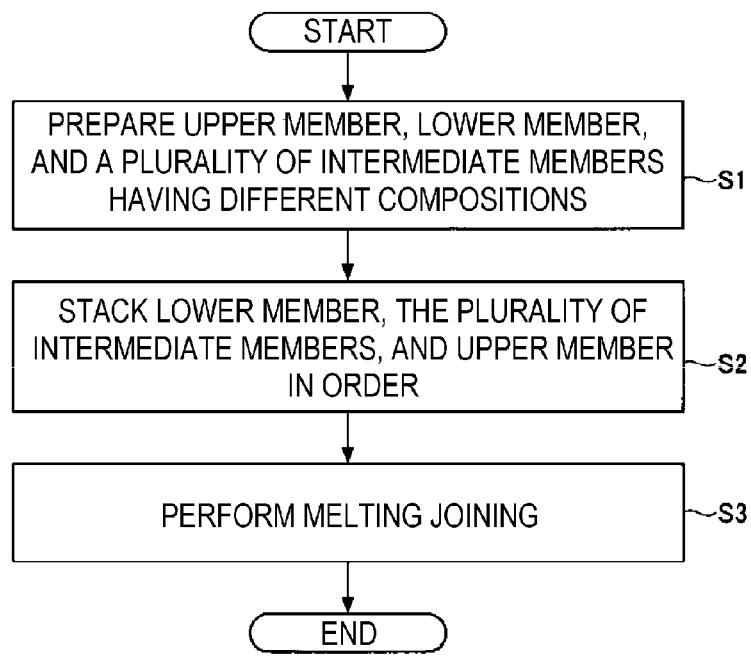
FIG. 5 is a flow chart illustrating a manufacturing method of an edge ring including an intermediate member according to the embodiment.
Figure 6A:
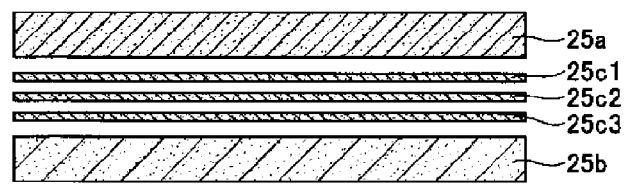
FIGS. 6A to 6C are views for explaining the manufacturing method of the edge ring including the intermediate member according to the embodiment.
Figure 6B:
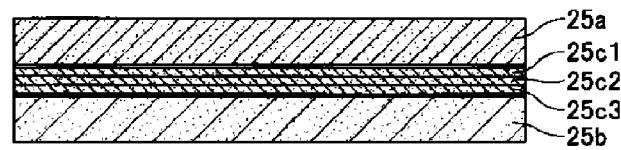
Figure 6C:
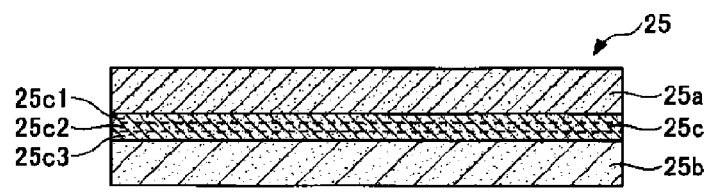

Next, descriptions will be made on a manufacturing method of the edge ring 25 including the intermediate member 25c among the edge rings 25 according to the embodiment and the modifications with reference to FIG. 5 and FIGS. 6A to 6C. FIG. 5 is a flow chart illustrating the manufacturing method of the edge ring 25 including the intermediate member 25c according to the embodiment. FIGS. 6A to 6C are views for explaining the manufacturing method of the edge ring 25 including the intermediate member 25c according to the embodiment. The following is an example of the manufacturing method of the edge ring 25 including the intermediate member 25c, and the manufacturing method is not limited thereto.

In the processing, in step S1, the upper member 25a, the lower member 25b, and a plurality of intermediate plate-like members having different compositions are prepared. In an example in FIG. 6A, the upper member 25a, a plurality of intermediate members 25c1, 25c2, and 25c3, and the lower member 25b having the same ring shape are prepared. The intermediate members 25c1, 25c2, and 25c3 may be collectively referred to as the intermediate member 25c.

When the upper member 25a is made of silicon carbide, and the lower member 25b is made of silicon, the intermediate member 25c1 is formed with a blending ratio in which the ratio of silicon carbide to silicon is higher than that of the other intermediate members 25c2 and 25c3. The intermediate member 25c3 is formed with a blending ratio in which the ratio of silicon to silicon carbide is higher than that of the other intermediate members 25c1 and 25c2. A blending ratio of silicon carbide to silicon in the intermediate member 25c2 may be lower than that of the intermediate member 25c1 and higher than that of the intermediate member 25c3.

By joining the intermediate members 25c1 to 25c3 having different compositions together, it is possible to form a composition gradient layer in which the mixing ratio of silicon carbide to silicon is set to be higher as closer to the upper member 25a and lower as closer to the lower member 25b.

Returning to FIG. 5, subsequently, in step S2, the lower member 25b, the intermediate member 25c3, the intermediate member 25c2, the intermediate member 25c1, and the upper member 25a are stacked in this order. As a result, as illustrated in FIG. 6B, all the members are stacked in order.

Returning to FIG. 5, subsequently, in step S3, all the stacked members are subjected to a melting joining, and the processing is ended. As a result, the surface of each member is melted, and joined to the adjacent member. As a result, as illustrated in FIG. 6C, all the members are subjected to a melting joining, and the edge ring 25 is manufactured.

The manufactured edge ring 25 may be deformed after the melting joining. In this case, the upper surface and the lower surface of the edge ring 25 are flattened by cutting.

The manufacturing method of the edge ring 25 described above is an example, and the manufacturing method is not limited thereto. For example, the intermediate members 25c1 to 25c3 may be subjected to a melting joining in advance and integrated, and then, the intermediate member 25c is interposed between the upper member 25a and the lower member 25b to be subjected a melting joining.

Further, when the edge ring 25 is manufactured using a sputter device or a CVD device, the upper member 25a (the lower member 25b) may be formed at first, the intermediate members 25c1 to 25c3 are formed in order, and then, the lower member 25b (the upper member 25a) are subjected to a melting joining.

As described above, according to the edge ring 25, the plasma processing apparatus 1, and the manufacturing method of the edge ring, it is possible to suppress the consumption of the edge ring 25, and thus, to decrease the leakage of the heat transfer gas from the gap between the edge ring 25 and the electrostatic chuck 20.

For example, the first member and/or the second member of the edge ring 25 may be doped with impurities such as nitrogen at a level that does not affect the process such as etching. Polycrystalline silicon may be used as the second material. As a result, breakage may also be reduced at the time of joining or during use. Amorphous silicon may be used as the second material. As a result, breakage may also be further reduced at the time of joining or during use.

The plasma processing apparatus of the present disclosure may be applied to any type of the apparatus of an atomic layer deposition (ALD) apparatus, a capacitively coupled plasma (CCP), an inductively coupled plasma (ICP), a radial line slot antenna (RLSA), an electron cyclotron resonance plasma (ECR), and a helicon wave plasma (HWP).

According to an aspect, it is possible to provide an edge ring that reduces leakage of a heat transfer gas from a gap between an edge ring and an electrostatic chuck while suppressing consumption of the edge ring.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An edge ring comprising:
   a first edge ring integrally formed by silicon carbide and configured to surround a periphery of a substrate provided in a processing container of a plasma processing apparatus, a top surface of the first edge ring being a contact surface with plasma generated inside the processing container; and
   a second edge ring formed by silicon and configured to surround the periphery of the substrate, a top surface of the second edge ring being bonded to a side opposite to the contact surface of the first edge ring, and a bottom surface of the second edge ring contacting with an electrostatic chuck,
   wherein the second edge ring is divided into a plurality of parts in a circumferential direction, and a groove is formed between each of the plurality of parts such that adjacent parts among the plurality of parts of the second edge ring have a predetermined distance therebetween in the circumferential direction, and
   wherein the groove is formed by side walls of the adjacent parts of the second edge ring, and a bottom wall of the first edge ring that serves as a ceiling wall when viewed in a vertical cross section.

2. The edge ring according to claim 1, wherein the first edge ring covers a side surface of the second edge ring.

3. The edge ring according to claim 2, wherein the first edge ring covers a side surface of an outer circumferential side of the second edge ring.

4. The edge ring according to claim 2, wherein the first edge ring covers a side surface of an inner circumferential side of the second edge ring.

5. The edge ring according to claim 3, wherein the first edge ring covers a side surface of an inner circumferential side of the second edge ring.

6. A plasma processing apparatus comprising:
   a processing container;
   a stage disposed inside the processing container and configured to place a substrate thereon; and
   an edge ring configured to surround a periphery of the substrate placed on the stage,
   wherein the edge ring includes:
   a first edge ring integrally formed by silicon carbide, a top surface of the first edge ring being a contact surface with plasma generated inside the processing container; and
   a second edge ring formed by silicon, a top surface of the second edge ring being bonded to a side opposite to the contact surface of the first edge ring, and a bottom surface of the second edge ring contacting with an electrostatic chuck,
   wherein the second edge ring is divided into a plurality of parts in a circumferential direction, and a groove is formed between each of the plurality of parts such that adjacent parts of the second edge ring have a predetermined distance therebetween in the circumferential direction, and wherein the groove is formed by side walls of the adjacent parts of the second edge ring, and a bottom wall of the first edge ring that serves as a ceiling wall when viewed in a vertical cross section.

7. An edge ring comprising:
a first edge ring integrally formed by silicon carbide and configured to surround a periphery of a substrate provided in a processing container of a plasma processing apparatus, a top surface of the first edge ring being a contact surface with plasma generated inside the processing container;
a second edge ring formed by a material in which the silicon carbide and silicon are mixed in a predetermined ratio and configured to surround the periphery of the substrate, a top surface of the second edge ring being bonded to a side opposite to the contact surface of the first edge ring; and
a third edge ring formed by the silicon and configured to surround the periphery of the substrate, a top surface of the third edge ring being bonded to a bottom surface of the second edge ring and a bottom surface of the third edge ring contacting with an electrostatic chuck,
wherein the third edge ring is divided into a plurality of parts in a circumferential direction, and a groove is formed between each of the plurality of parts such that adjacent parts of the third edge ring have a predetermined distance therebetween in the circumferential direction, and
wherein the groove is formed by side walls of the adjacent parts of the third edge ring, and a bottom wall of the first edge ring that serves as a ceiling wall when viewed in a vertical cross section.

8. The edge ring according to claim 7, wherein the second edge ring is formed by a material in which the silicon carbide and the silicon are mixed in a discretely changing ratio.

9. The edge ring according to claim 7, wherein the second edge ring is formed by a material in which the silicon carbide and the silicon are mixed in a continuously changing ratio.

10. The edge ring according to claim 7, wherein the first edge ring covers a side surface of the second edge ring, and the second edge ring covers a side surface of an outer circumferential side of the third edge ring.

11. The edge ring according to claim 10, wherein the first edge ring covers a side surface of an outer circumferential side of the second edge ring, and the second edge ring covers a side surface of an outer circumferential side of the third edge ring.

12. The edge ring according to claim 10, wherein the first edge ring covers a side surface of an inner circumferential side of the second edge ring, and the second edge ring covers a side surface of an inner circumferential side of the third edge ring.

13. The edge ring according to claim 11, wherein the first edge ring covers a side surface of an inner circumferential side of the second edge ring, and the second edge ring covers a side surface of an inner circumferential side of the third edge ring.

14. The edge ring according to claim 1, wherein the plurality of parts of the second edge ring has a same shape from each other, and is evenly disposed in the circumferential direction.

* * * * *